United States Patent [19]
Loeffler

[11] Patent Number: 6,142,830
[45] Date of Patent: *Nov. 7, 2000

[54] SIGNALING IMPROVEMENT USING EXTENDED TRANSMISSION LINES ON HIGH SPEED DIMMS

[75] Inventor: Steffen Loeffler, Essex Jct., Vt.

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 09/036,319

[22] Filed: Mar. 6, 1998

[51] Int. Cl.$^7$ .................................................. H01R 13/66
[52] U.S. Cl. .......................................... 439/620; 361/788
[58] Field of Search .............................. 439/55, 76.1, 79, 439/620; 361/788

[56] References Cited

U.S. PATENT DOCUMENTS

| | | | |
|---|---|---|---|
| 4,656,605 | 4/1987 | Clayton | 365/52 |
| 4,697,858 | 10/1987 | Balakrishnan | 439/61 |
| 5,260,892 | 11/1993 | Testa | 365/63 |
| 5,430,859 | 7/1995 | Norman et al. | 395/425 |
| 5,530,623 | 6/1996 | Sanwo et al. | 361/788 |
| 5,532,954 | 7/1996 | Bechtolsheim et al. | 365/52 |

*Primary Examiner*—Khiem Nguyen
*Attorney, Agent, or Firm*—Stanton C. Braden

[57] ABSTRACT

A circuit board such as a memory module board mounts a plurality of memory modules that are electrically connected to a module bus on a first surface of the board. The module bus is coupled to a connector at a first end thereof that permits an electrical coupling of a plurality of electrical conductors of the module bus to an external large integrated circuit board, and a terminating resistor device at a second end thereof for properly terminating predetermined ones of the plurality of electrical conductors of the module bus. The module bus is extended beyond the last memory module along the bus by a length which is sufficient to substantially limit reflections and/or crosstalk between the conductors and thereby improve signaling along the module bus. In a first embodiment, the module bus is extended around an edge of the board and for a predetermined distance over any unused portions of the backside of the board. In a second embodiment, the module bus is extended for a maximum predetermined distance along any unused portions of the front side of the board when the backside of the board is unavailable for extending the module bus.

16 Claims, 2 Drawing Sheets

SIGNALING IMPROVEMENT USING EXTENDED TRANSMISSION LINES ON HIGH SPEED DIMMS

FIELD OF THE INVENTION

The present invention relates to an arrangement for improving signaling for high speed Dual Inline Memory Modules (DIMMS) used on integrated circuit chips such as a Synchronous Dynamic Random Access Memory (SDRAM) buffered module and other circuits.

BACKGROUND OF THE INVENTION

Memory packaging arrangements for high speed computers and other devices include a plurality of memory module sockets mounted on a printed circuit board and coupled to a module bus that is printed thereon. For example, U.S. Pat. No. 5,530,623 (Sanwo et al.), issued on Jun. 25, 1996, discloses a high speed memory packaging scheme comprising a plurality of memory module connectors mounted on a printed circuit board and interconnected by a plurality of transmission lines forming a bus on the printed circuit board. Each of the transmission lines sequentially connects respective points on the plurality of connectors which are connected in a same sequence by each of the transmission lines. Each connector is designed to receive a memory module, such as a Single In-line Memory Module (SIMM), and provides electrical connections between the plurality of transmission lines and memory logic within a memory module that is coupled to the connector. Each connector further provides an open circuit in each of the transmission lines in the absence of a memory module being coupled to the connector. Therefore, in one embodiment, a termination module including termination resistors corresponding to the plurality of transmission lines is provided for installation into the connector immediately following the connector(s) into which memory modules are installed. Still further, discrete termination resistors are provided in the printed circuit board at the end of predetermined ones of the transmission lines adjacent the last connector so that all connectors can be utilized.

Referring now to FIG. 1, there is shown a Dual Inline Memory Module (DIMM) 10 (shown within a dashed line rectangle) which corresponds to an arrangement for a Synchronous Link Dynamic Random Access Memory (SLDRAM) type of buffered module as recently proposed by the SLDRAM Consortium for such memory modules. The DIMM 10 comprises a printed circuit board 12 comprising a connector 14 mounted on one end thereof, a module bus 16 comprising a plurality of parallel conductors (not shown) coupled at first ends thereof to predetermined terminals (not shown) of the connector 14, a buffer chip 18 coupled to predetermined conductors of the module bus 16, a plurality of DRAM memory modules 20 (of which eight modules 20 are shown) coupled to the module bus 16, and a terminating resistor device (TERM. RESIS.) 22 coupled to second ends of predetermined conductors of the module bus 16 adjacent to the last DRAM memory module 20 location along the module bus 16. The connector 14 is used to connect the printed circuit board 12 to a much larger integrated circuit board (not shown), while the buffer chip 18 provides appropriate buffering for signals propagating along the module bus 16 between the circuits on the larger integrated circuit board and the memory modules 20. This is similar to the arrangement disclosed in FIG. 3 of U.S. Pat. No. 5,530,623, cited hereinbefore. The arrangement of FIG. 1 has been found to have severe signaling problems caused by reflections and/or crosstalk along a module bus 16. More particularly, the electrical conductors of the module bus 16 are not terminated with the proper impedance ($Z_0$) of these transmission lines, but are instead a lesser impedance value in order to increase the speed of the DIMM. It is found that under such condition, when reading from the eighth or last memory module 20 along the module bus 16, the specified values for the high and low output voltages cannot be satisfied.

It is desirable to provide an arrangement which permits the module bus 16 to be terminated with appropriate resistances to overcome the problem found in prior art arrangements, while permitting the memory modules 20 to be mounted along the module bus 16 to operate at a high speed.

SUMMARY OF THE INVENTION

The present invention is directed to a circuit boards such as, for example, a Memory Module board comprising a plurality of memory modules that are coupled to a module bus wherein the bus is extended beyond a last memory module coupled to the bus with a length that improves signaling along the module bus by severely limiting any reflections and/or crosstalk in the module bus when terminated to a termination resistor device at a second end of the bus.

Viewed from one aspect, the present invention is directed to a Memory Module board comprising a printed circuit board having first and second opposing sides, a plurality of memory modules mounted on the first side of the printed circuit board, a module bus, and a terminating resistor device. The module bus comprises a plurality of separate parallel electrical conductors extending between first and second ends thereof which are printed on the printed circuit board. The plurality of parallel electrical conductors are coupled to predetermined ones of the memory modules, and each of the conductors has a portion thereof extending beyond the last memory module and to the second end thereof by a length which is sufficient to substantially limit reflections and/or crosstalk between the conductors. The terminating resistor device is coupled to predetermined second ends of the plurality of electrical conductors of the module bus for providing predetermined terminating resistances thereto.

Viewed from another aspect, the present invention is directed to a Memory Module board comprising a printed circuit board having first and second opposing sides, a plurality of memory modules mounted on the first side of the printed circuit board, a module bus, and a terminating resistor device. The module bus comprises a plurality of separate parallel electrical conductors extending between first and second ends thereof which are printed on the printed circuit board. The plurality of parallel electrical conductors are coupled to predetermined ones of the sequentially positioned memory modules between first and second ends of the plurality of conductors, and each conductor has a portion thereof extending beyond the last memory module, around an edge of the printed circuit board, and along unused sections of the second side of the printed circuit board to the second end thereof by a length which is sufficient to substantially limit reflections and/or crosstalk between the electrical conductors thereof. The terminating resistor device is coupled to predetermined second ends of the plurality of electrical conductors of the module bus for providing predetermined terminating resistances thereto.

Viewed from still another aspect, the present invention is directed to a Memory Module board comprising a printed circuit board having first and second opposing sides, a plurality of memory modules mounted on the first side of the printed circuit board, a module bus, and a terminating resistor device. The module bus comprises a plurality of separate parallel electrical conductors printed on the printed circuit board. The plurality of parallel electrical conductors are coupled to predetermined ones of the sequentially positioned memory modules, and each conductor has a portion thereof extending beyond the last memory module and to the second ends thereof along unused portions of the first side of the printed circuit board by a length which is sufficient to substantially limit reflections and/or crosstalk between the conductors thereof. The terminating resistor device coupled to predetermined second ends of the plurality of electrical conductors of the module bus for providing predetermined terminating resistances thereto.

Viewed from still another aspect, the present invention is directed to a printed circuit board having first and second opposing surfaces comprising a plurality of circuit modules mounted on the first surface of the printed circuit board, a module bus, and a terminating resistor device. The module bus comprises a plurality of separate parallel electrical conductors extending between first and second ends thereof which are printed on the printed circuit board. Each of the plurality of parallel electrical conductors are coupled to predetermined ones of the circuit modules, and each conductor having a portion thereof extending beyond the last circuit module and to the second end thereof by a length which is sufficient to substantially limit reflections and/or crosstalk between the electrical conductors. The terminating resistor device is coupled to second ends of predetermined ones of the plurality of electrical conductors of the module bus for providing predetermined terminating resistances thereto.

The invention will be better understood from the following more detailed description taken with the accompanying drawings and claims.

The drawings are not necessarily to scale.

DETAILED DESCRIPTION

It is to be understood that corresponding elements performing the same function in each of the figures have been given the same designation number.

Figure 1:
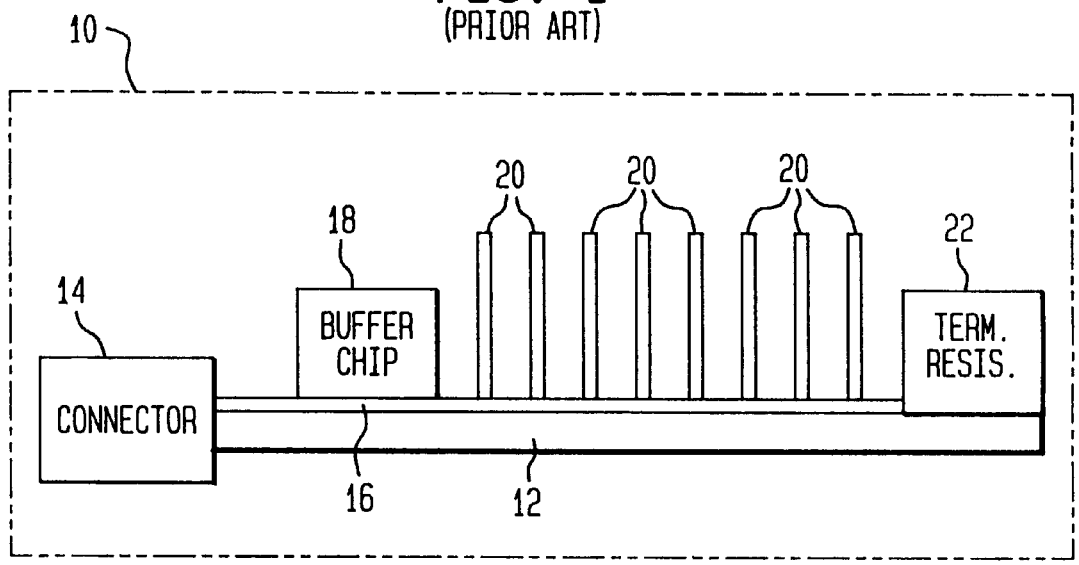
FIG. 1 is a side view of a prior art Memory Module.
Figure 2:
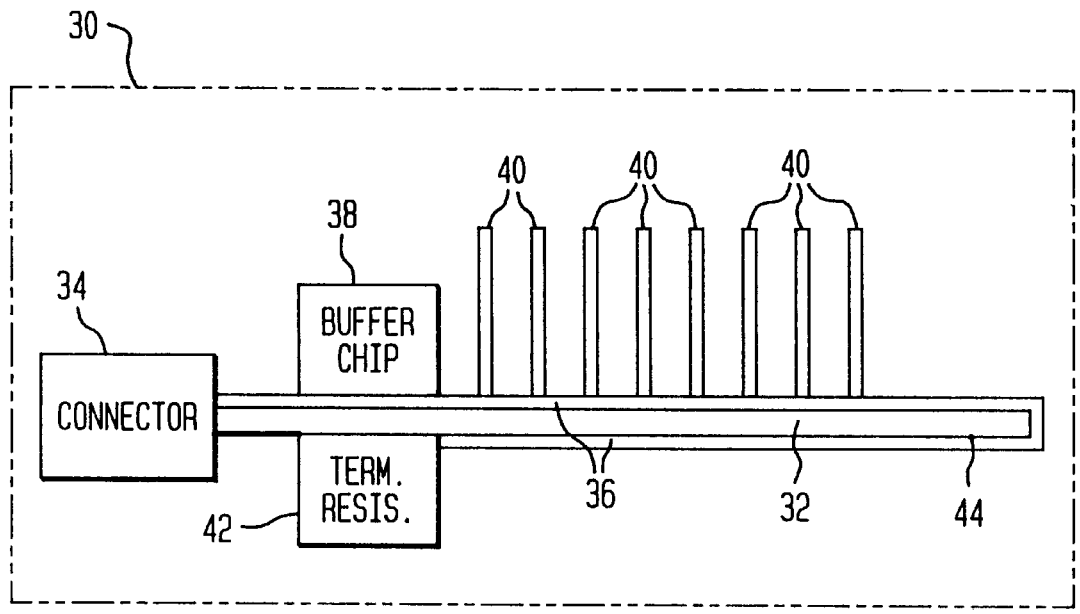
FIG. 2 is a side view of a Dual Inline Memory Module (DIMM) in accordance with a first embodiment of the present invention.

Referring now to FIG. 2, there is shown a side view of a Memory Module board 30 (shown within a dashed line rectangle) in accordance with an embodiment of the present invention. The Memory Module board 30 comprises a printed circuit board 32 comprising a connector 34 mounted on one end of the printed circuit board 32, a module bus 36 printed on the printed circuit board 32 comprising a plurality of parallel conductors (not shown) coupled at first ends thereof to predetermined terminals (not shown) of the connector 34, a buffer chip 38 mounted adjacent the connector 34 and coupled to predetermined conductors of the module bus 36, a plurality of memory integrated circuits or modules 40 (of which eight modules 40 are shown) which are sequentially coupled to the module bus 36, and a terminating resistor device (TERM. RESIS.) 42 coupled to second ends of predetermined conductors of the module bus 36. The memory modules, for example, are dynamic random access memory (DRAM) modules, synchronous DRAM (SDRAM) modules, or other types of memory modules. The connector 34 is used to connect the Memory Module board 30 to a much larger integrated circuit board (not shown), while the buffer chip 38 provides appropriate buffering for signals propagating along the module bus 36 between circuits on the larger integrated circuit board and the memory modules 40.

In accordance with the present invention, the module bus 36 is extended well beyond the last memory modules 40 coupled to the module bus 36 on a first side of the circuit board 32. More particularly, the module bus is extended so that the terminating resistor device 42 is located at a length from the last memory module 40 along the module bus 36 which is sufficient to substantially limit any reflections and/or crosstalk between conductors of the module bus 36. To achieve this sufficient length beyond the last memory module 40, the module bus 36 is extended around an end of the printed circuit board 32 and onto an unused portion of the opposing backside 44 of the printed circuit board 32. The module bus 36 is extended for a predetermined length along the backside 44 of the printed circuit board 32, and terminated with the terminating resistor device 42. Preferably the terminating resistor device 42 can be located on the backside 44 of the printed circuit board 32 near the connector 34 to provide a longest extended length for the module bus 36.

It is to be understood that the terminating resistor device 42 does not necessarily have to be located adjacent the connector 34, but simulation techniques have indicated that the longer the module bus 36 is extended from the last memory module 40, the better are the results that are obtained for limiting reflections and/or crosstalk between the electrical conductors of the module bus 36. More particularly, the parameters which can determine the length of the module bus 36 beyond the last memory module 40 along the bus 36 are, for example, the correct size of a termination resistance, the frequency of the signals propagating on the module bus 36, and the temperature of the Memory Module board 30. Of the three parameters, the frequency of the signals propagating on the memory bus 36 is believed to be the more important parameter.

Figure 3:
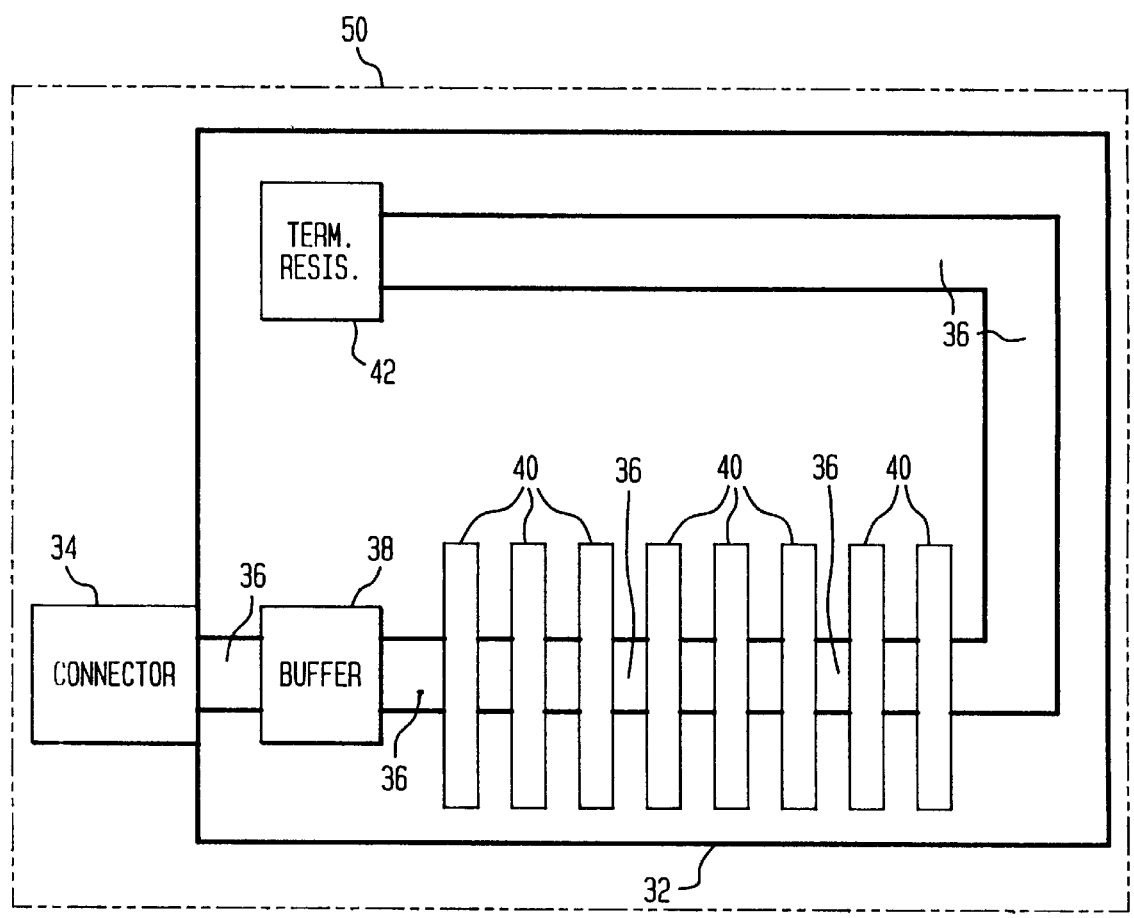
FIG. 3 is a top view of a DIMM in accordance with a second embodiment of the present invention.

Referring now to FIG. 3, there is shown a top view of Memory Module board 50 (shown within a dashed line rectangle) in accordance with a second embodiment of the present invention. The Memory Module board 50 comprises a printed circuit board 32 comprising a connector 34 mounted on one end or edge of the printed circuit board 32, a module bus 36 printed on the printed circuit board 32 comprising a plurality of parallel electrical conductors (not shown) coupled at first ends thereof to predetermined terminals (not shown) of the connector 34, a buffer chip 38 mounted adjacent the connector 34 and coupled to predetermined conductors of the module bus 36, a plurality of Dynamic Random Access Memory (DRAM) modules 40 (of which eight modules 40 are shown) which are sequentially coupled to the module bus 36, and a terminating resistor device (TERM. RESIS.) 42 coupled to second ends of predetermined conductors of the module bus 36. The elements 34, 36, 38, 40 and 42 and connected and function in the same manner as described hereinbefore for the correspondingly numbered elements of FIG. 2.

In accordance with the second embodiment of the present invention, where the backside 44 (shown in FIG. 2) of the printed circuit board is not available for extending the module bus 36 because the backside 44 is used for other purposes, the module bus 36 is extended for a maximum distance available on the front side of the printed circuit board 32. More particularly, the module bus 36 is extended beyond the last memory module 40 on the bus along portions of the front side of the printed circuit board 32 not used by other circuit components (not shown).

It is to be appreciated and understood that the specific embodiments of the present invention described hereinabove are merely illustrative of the general principles of the invention. Various modifications may be made by those skilled in the art which are consistent with the principles set forth. For example, any arrangement other than those shown in FIGS. 2 and 3 can be used where the module bus 36 is extended for a maximum length on any unused portion of a Memory Module board (e.g., boards 30 or 50) so as to improve signaling therealong by severely limiting reflections and/or crosstalk that might appear on the module bus 36. Still further, it is to be understood that the present invention of improving signaling along a bus on a printed circuit board might be applicable to modules other than Memory modules.

What is claimed is:

1. A Memory Module board comprising:
   a printed circuit board having first and second opposing surfaces;
   a plurality of memory modules mounted on the first surface of the printed circuit board;
   a module bus comprising a plurality of separate parallel continuous electrical conductors extending between first and second ends thereof which are printed on the printed circuit board, the plurality of parallel electrical conductors being coupled to predetermined ones of the memory modules and each of the conductors having a portion thereof extending beyond the last memory module and to the second end thereof by a length which is greater than a distance between adjacent memory modules and is sufficient to substantially limit reflections and/or crosstalk between the electrical conductors; and
   a terminating resistor device coupled to second ends of predetermined ones of the plurality of electrical conductors of the module bus for providing predetermined terminating resistances thereto.

2. The Memory Module board of claim 1 further comprising a connector mounted at one edge of the memory module board for coupling the first ends of the plurality of electrical conductors of the module bus to an external device.

3. The Memory Module board of claim 1 wherein the Memory Module board is a Dual Inline Memory Module.

4. The Memory Module board of claim 1 wherein the portion of the module bus which extends beyond the last memory module is extended around an edge of the printed circuit board and along the second surface of the printed circuit board by a length which is sufficient to substantially limit reflections and/or crosstalk between the conductors when terminated by the terminating resistor device.

5. The Memory Module board of claim 1 wherein the portion of the module bus which extends beyond the last memory module is extended along unused portions of the first surface of the printed circuit board by a length which is sufficient to substantially limit reflections and/or crosstalk between the conductors when terminated by the terminating resistor device.

6. A Memory Module board comprising:
   a printed circuit board having first and second opposing surfaces;
   a plurality of memory modules mounted on the first surface of the printed circuit board;
   a module bus comprising a plurality of separate parallel electrical conductors extending between first and second ends thereof which are printed on the printed circuit board, the plurality of parallel electrical conductors being coupled to predetermined ones of the memory modules between first and second ends of the plurality of conductors, and each conductor having a portion thereof extending beyond the last memory module around an edge of the printed circuit board and along an unused section of the second surface of the printed circuit board to the second end thereof by a length which is sufficient to substantially limit reflections and/or crosstalk between the conductors thereof; and
   a terminating resistor device coupled to second ends of predetermined ones of the plurality of electrical conductors of the module bus for providing predetermined terminating resistances thereto.

7. The Memory Module board of claim 6 further comprising a connector mounted at one edge of the memory module board for coupling the first ends of the plurality of electrical conductors of the module bus to an external device.

8. The Memory Module board of claim 6 wherein the Memory Module board is a Dual Inline Memory Module.

9. A Memory Module board comprising:
   a printed circuit board having first and second opposing surfaces;
   a plurality of memory modules mounted on the first surface of the printed circuit board;
   a module bus comprising a plurality of separate parallel continuous electrical conductors printed on the printed circuit board, the plurality of parallel electrical conductors being coupled to predetermined ones of the memory modules, and each conductor having a portion thereof extending beyond the last memory module and to a second end thereof along unused portions of the first surface of the printed circuit board by a length which is greater than a distance between adjacent memory modules and is sufficient to substantially limit reflections and/or crosstalk between the conductors thereof; and
   a terminating resistor device coupled to predetermined second ends of the plurality of electrical conductors of the module bus for providing predetermined terminating resistances thereto.

10. The Memory Module board of claim 9 further comprising a connector mounted at one edge of the memory module board for coupling the first ends of the plurality of electrical conductors of the module bus to an external device.

11. The Memory Module board of claim 9 wherein the Memory Module board is a Dual Inline Memory Module.

12. A printed circuit board having first and second opposing surfaces comprising:
   a plurality of circuit modules mounted on the first surface of the printed circuit board;
   a module bus comprising a plurality of separate parallel continuous electrical conductors extending between first and second ends thereof which are printed on the printed circuit board, each of the plurality of parallel electrical conductors being coupled to predetermined ones of the circuit modules, and each conductor having a portion thereof extending beyond the last circuit module and to the second end thereof by a length which is greater than a distance between adjacent memory modules and is sufficient to substantially limit reflections and/or crosstalk between the electrical conductors; and a terminating resistor device coupled to second ends of predetermined ones of the plurality of electrical conductors of the module bus for providing predetermined terminating resistances thereto.

13. The printed circuit board of claim 12 further comprising a connector mounted at one edge of the circuit board for coupling the first ends of the plurality of electrical conductors of the module bus to an external device.

14. The printed circuit board of claim 12 wherein the Memory Module board is a Dual Inline Memory Module.

15. The printed circuit board of claim 12 wherein the portion of the module bus which extends beyond the last circuit module is extended around an edge of the printed circuit board and along the second surface of the printed circuit board by a length which is sufficient to substantially limit reflections and/or crosstalk between the conductors when terminated by the terminating resistor device.

16. The printed circuit board of claim 12 wherein the portion of the module bus which extends beyond the last circuit module is extended along unused portions of the first surface of the printed circuit board by a length which is sufficient to substantially limit reflections and/or crosstalk between the conductors when terminated by the terminating resistor device.

* * * * *